(12) United States Patent
Hayworth et al.

(10) Patent No.: US 6,627,003 B2
(45) Date of Patent: Sep. 30, 2003

(54) NMR SHIM FORMING METHOD

(75) Inventors: Gregory F. Hayworth, Waukesha, WI (US); Delton A. Grey, Jr., Florence, SC (US); Granville G. Ward, Jr., Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 47 days.

(21) Appl. No.: 09/683,488

(22) Filed: Jan. 7, 2002

(65) Prior Publication Data

US 2003/0075243 A1 Apr. 24, 2003

Related U.S. Application Data

(63) Continuation of application No. 09/682,847, filed on Oct. 24, 2001, now abandoned.

(51) Int. Cl.[7] ............................................ H04B 1/713
(52) U.S. Cl. ........................................................ 148/104
(58) Field of Search ............................... 148/104, 101, 148/102; 252/62.54, 62.53, 62.55, 62.52

(56) References Cited

U.S. PATENT DOCUMENTS

| | | | |
|---|---|---|---|
| 4,631,481 A | * 12/1986 | Young et al. | 324/320 |
| 4,737,717 A | 4/1988 | Petro | |
| 5,003,266 A | 3/1991 | Palkovich et al. | |
| 5,003,276 A | 3/1991 | Sarwinski et al. | |
| 5,168,231 A | 12/1992 | Aubert | |
| 5,168,232 A | 12/1992 | Glover et al. | |
| 5,621,324 A | * 4/1997 | Ota et al. | 324/319 |
| 5,635,839 A | 6/1997 | Srivastava et al. | |
| 5,923,235 A | 7/1999 | Van Oort | |
| 5,999,076 A | 12/1999 | Becker, Jr. et al. | |
| 6,150,819 A | * 11/2000 | Laskaris et al. | 324/319 |
| 6,218,838 B1 | 4/2001 | McGinley et al. | |
| 6,437,568 B1 | * 8/2002 | Edelstein et al. | 324/318 |

FOREIGN PATENT DOCUMENTS

| | | |
|---|---|---|
| EP | 0 285 852 | 10/1988 |
| GB | 2 252 630 | 8/1992 |
| JP | 4-181706 | 6/1992 |
| WO | WO88/08126 | 10/1988 |

OTHER PUBLICATIONS

English Language abstract of Japanese Patent Publication No. 04–181706, Jun. 29, 1992.*

* cited by examiner

Primary Examiner—John Sheehan
(74) Attorney, Agent, or Firm—Collard and Roe, P.C.

(57) ABSTRACT

A method of forming a shimming body for a NMR assembly is provided. A magnetizable metal powder of known magnetic properties is provided. The powder is uniformly dispersed into a non-magnetic material to form a mixture having a selected uniform density. A selected weight of magnetic material is determined for a particular installation of an NMR assembly. The mixture is heated. A selected volume corresponding to the selected weight of magnetic material is extruded into a container. The mixture is cooled to form a shimming body.

18 Claims, 2 Drawing Sheets

NMR SHIM FORMING METHOD

CROSS REFERENCE TO RELATED APPLICATIONS

This application is a continuation under 37 C.F.R. 1.53(b) of U.S. Ser. No. 09/682,847, filed Oct. 24, 2001, now abandoned, and claims priority thereon under 35 U.S.C. 120

BACKGROUND OF INVENTION

1. Field of the Invention

The present invention relates to the formation of shimming bodies for use in a nuclear magnetic resonance ("NMR") system. More particularly, the invention relates to an improved and simplified method for forming passive shimming bodies. The shimming bodies are for use in a superconducting magnet assembly for magnetic resonance imaging ("MRI").

2. The Prior Art

As is well known, a superconducting magnet can be made superconducting by placing it in an extremely cold environment. For example, the magnet can be enclosed in a cryostat or pressure vessel containing liquid helium or other cryogen. The extreme cold ensures that the magnet coils are superconducting. The current introduced by a power source will continue to flow through the coils even after power is removed. This continuance of current flow is due to the absence of resistance, and a strong magnetic field is maintained thereby. Superconducting magnets find wide application in the field of MRI.

To compensate for inhomogeneities in NMR or MRI magnets, various arrangements including passive ferromagnetic shim materials have been used. For example, U.S. Pat. No. 5,003,266 to Palkovich et al., U.S. Pat. No. 5,168,231 to Aubert, U.S. Pat. No. 5,923,235 to Van Oort, U.S. Pat. No. 5,999,076 to Becker, Jr. et al. and U.S. Pat. No. 6,218,838 to McGinley et al. disclose passive shimming systems for magnetic resonance magnets.

Open architecture MRI magnets tend to produce increased field inhomogeneity due to increased coil deformation and coil misalignment. Such inhomogeneity is minimized during the design stage, and then passive shim systems are added. The passive shim systems reduce the inhomogeneity that remains after the manufacturing cycle due to manufacturing tolerances and design restrictions. The passive shims are positioned between the imaging bore and the gradient coil. For example, rails having shim disks in pockets may be spaced around the magnet bore axis.

NMR shimming requires that a specific amount of ferromagnetic material be installed in a specific location. The amount varies by location due to magnetic material in the vicinity of the magnet at the installation site. The current method installs pellets in a preformed disk to obtain the desired amount of ferromagnetic material in the disk. The disks, however, must be manually and laboriously populated to produce the amount of magnetic material in each disk. A second drawback to this approach is that the pellets are added in relatively large increments making exact shimming difficult. A third drawback is that the cost of the populated disks is relatively high.

Accordingly, a method of forming a shimming body is needed that will eliminate the laborious pellet loading. A method is also needed that will eliminate the relatively incremental nature of the "pellets in disks" method. Also needed is a method that will lower the cost of the shimming disk.

SUMMARY OF INVENTION

A method of forming a shimming body is provided. In accordance with one form of the invention, a magnetizable metal powder, such as a ferrous powder, of known magnetic properties is provided. The powder is uniformly dispersed into a non-magnetic or non-ferrous material. A mixture is formed having a selected uniform density. A desired weight of magnetic material is selected for a particular installation of an NMR assembly. The mixture is heated. A selected volume of the mixture corresponding to the selected weight of magnetic material is extruded into a container. The mixture is then cooled to form a shimming body.

In another aspect, a method of forming a passive shimming disk for an open MRI assembly is provided. In this aspect, a neodymium-boron-iron alloy powder of known magnetic properties is provided. The powder is uniformly dispersed into a thermoplastic material to form a mixture having a selected uniform density. A weight of magnetic material in the mixture is determined for a particular installation of an MRI assembly. The mixture is heated. A selected volume of the heated mixture corresponding to the selected weight is extruded into an open U-shaped container. The container may be formed from a thermosetting plastic. The mixture is then cooled to form a shimming disk or body.

In another aspect, the cooled mixture is removed from the container to form the shimming disk or body.

In a further aspect, the container has a bottom and sides connected to the bottom formed from a thermosetting plastic. The mixture is cooled to form the shimming disk or body.

BRIEF DESCRIPTION OF DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, where similar reference characters denote similar elements throughout the several views.

DETAILED DESCRIPTION

Figure 1:
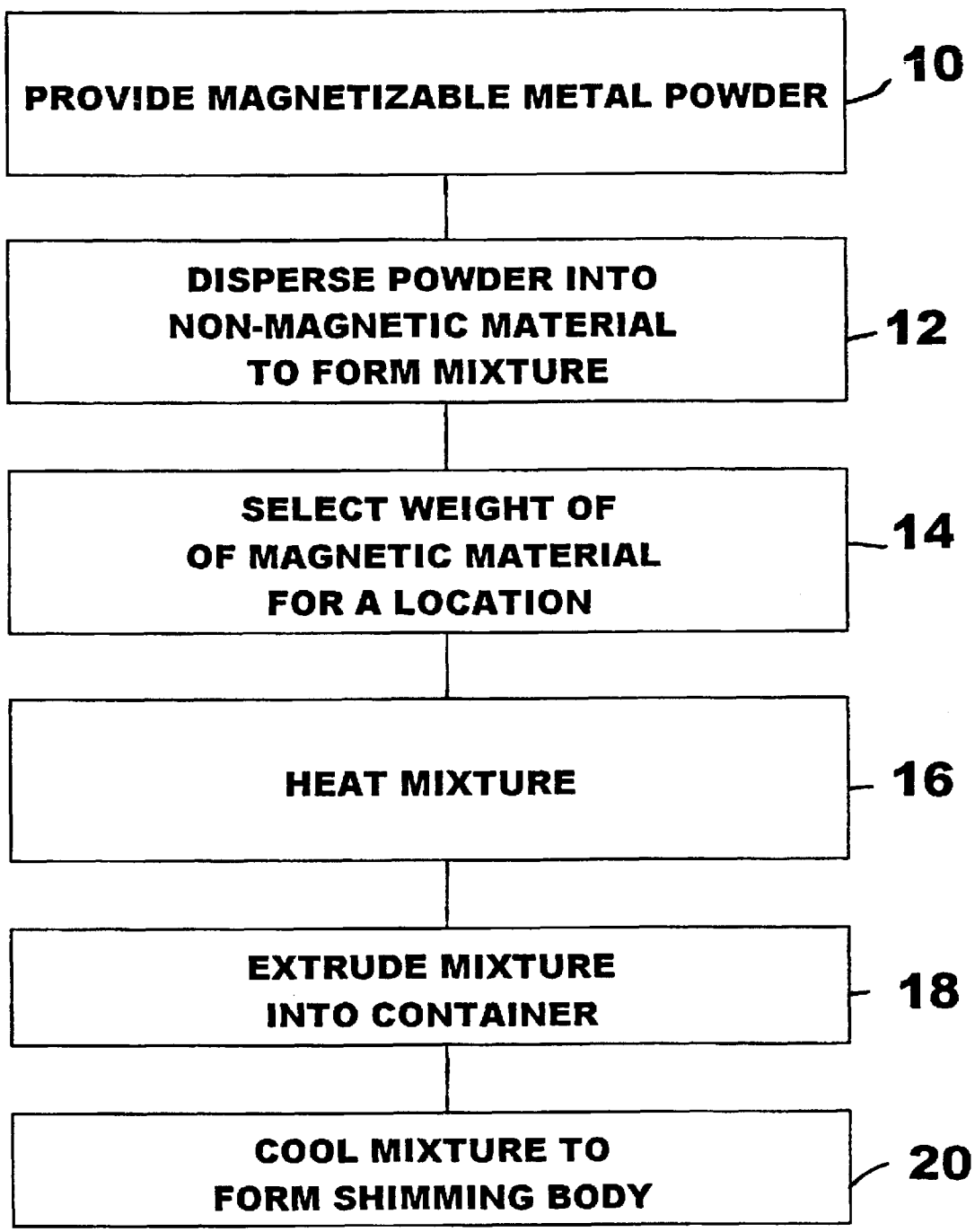
FIG. 1 is a general flow chart for a method of forming a shimming body in accordance with the present invention.

Referring to FIG. 1, a general flow chart for a method of forming a shimming body is shown. In the first step, block 10, a magnetizable metal powder, such as a ferrous or iron powder of known magnetic properties is provided. A permanent magnetic material which remains magnetic, even in magnetic fields of the 0.5–1.5 Tesla range may also be used. For example, a neodymium-boron-iron (NdBFe) alloy powder may be used. Alternatively, the magnetizable metal powder may be made from a samarium-cobalt alloy.

The second step of the overall process is represented in block 12. In this step, the powder is uniformly pre-dispersed into a non-ferrous or other non-magnetic material to form a mixture. The non-ferrous material is preferably a thermoplastic material which is non-magnetic and electrically insulating. This mixture has a known and uniform density consisting of the magnetic powder and the non-ferrous or thermoplastic material.

The desired weight of magnetic material is determined for a particular installation of an NMR assembly (block 14). Once the desired weight has been determined, the mixture is heated (block 16) and extruded into an appropriate container (block 18). The weight of magnetic material will be easily determined from the volume of mixture transferred to the container. The mixture will cool rapidly in block 20. The mixture therefore be capable of immediate transfer to the magnet shimming pockets of a passive shimming system. The resultant shimming body or disk will be inexpensive, easily populated (or filled), have magnetic symmetry and be very precise.

Figure 2:
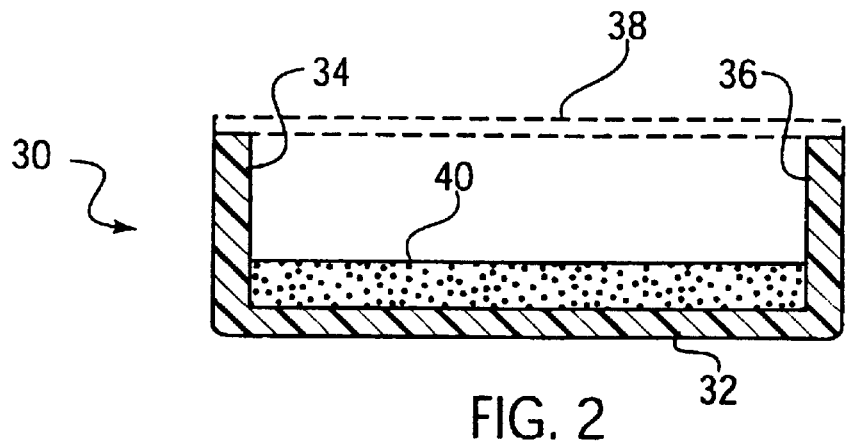
FIG. 2 is a simplified schematic view of a container partially filled with a mixture in accordance with an embodiment of the invention.
Figure 3:
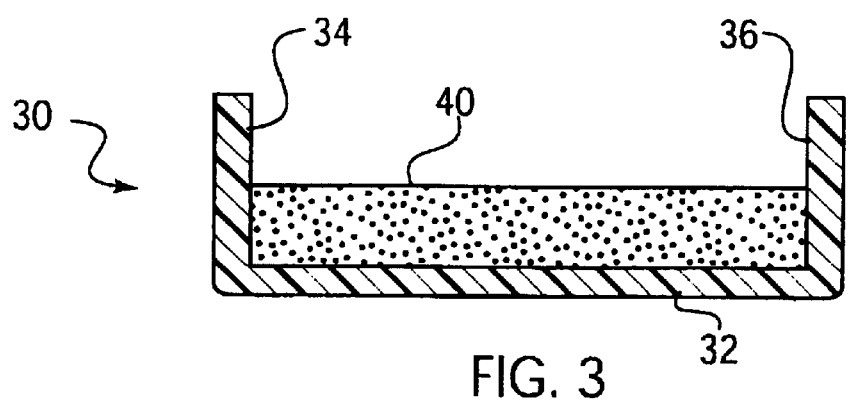
FIG. 3 is a simplified schematic view of a container half-filled with a mixture in accordance with another embodiment of the invention.
Figure 4:
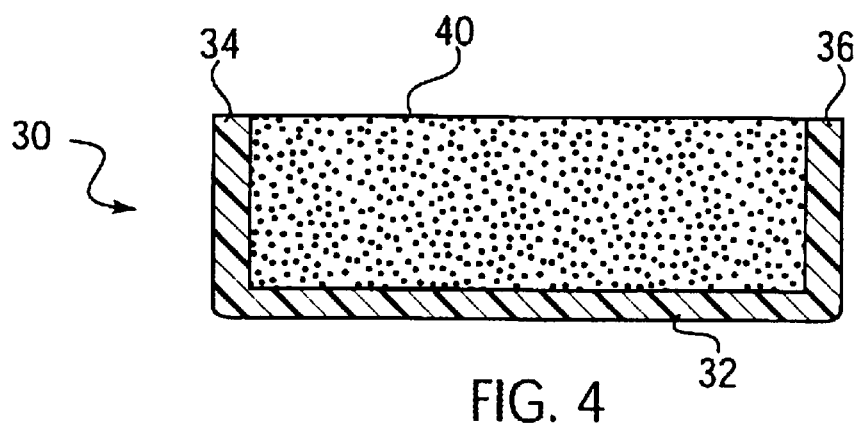
FIG. 4 is a simplified schematic view of a container completely filled with a mixture in accordance with a further embodiment of the invention.

Now referring to FIG. 2, a container 30 is shown. Container 30 preferably has an open "U" or low-profile bowl for receipt of a selected volume of the heated mixture 40. Container 30 has a bottom 32 and sides 34, 36 preferably formed of a thermosetting plastic. For example, a fiber-reinforced epoxy material which is magnetically and radio frequency transmissive may be used. Container 30 may be partially filled with heated mixture 40, for example 25% as shown in FIG. 2 or 50% as shown in FIG. 3. In addition, container 30 may be completely filled with heated mixture 40 as shown in FIG. 4. Essentially, any percentage of filling from 1% to 100% can be used depending on the particular needs and requirements.

A top 38 shown in dashed lines in FIG. 2 may be placed on sides 34, 36 after heated mixture 40 is extruded into container 30. Top 38 also is preferably formed from a thermosetting plastic. A container with these features could provide for location of the magnetic material within the shimming pockets. Filling, or partial of the container, could be accomplished as follows. First the mixture is heated. The desired amount of the heated mixture is then extruded into the container pocket as shown in FIGS. 2–4. The cooled mixture may be removed from the container and used as the shimming body. Alternatively, the container with the cooled mixture therein may be used as the shimming body.

The resolution of the ferrous powder distribution is limited only by the metering capability of the dispenser. Once formed, the shimming body or disk could be held in the shimming system by a positioning and locking method. A convenient positioning and locking method will be apparent to one skilled in the art.

Thus, a method of adding magnetic material is provided that eliminates the laborious pellet loading. The method also eliminates the relatively incremental nature of the "pellets in disks" method. The method also lowers the cost of the shimming body or disk produced.

While preferred embodiments of the present invention have been shown and described, it is to be understood that many changes and modifications may be made thereunto without departing from the spirit and scope of the invention as defined in the appended claims.

What is claimed is:

1. A method of forming a shimming body for a NMR assembly comprising the steps of:
   (a) providing a magnetizable metal powder of known magnetic properties;
   (b) uniformly dispersing said powder into a non-magnetic material to form a mixture having a selected uniform density;
   (c) determining a selected weight of magnetic material for a particular installation of an NMR assembly;
   (d) heating the mixture;
   (e) extruding a selected volume of the heated mixture corresponding to the selected weight of magnetic material into a container; and
   (f) cooling the mixture to form a shimming body.

2. The method according to claim 1 wherein the magnetizable metal powder is made from a samarium-cobalt alloy.

3. The method according to claim 1 wherein the container has an open "U" shape.

4. The method according to claim 1 wherein the non-magnetic material is a thermoplastic material.

5. A method of forming a shimming body for a NMR assembly comprising the steps of:
   (a) providing a ferrous powder of known magnetic properties;
   (b) uniformly dispersing said powder into a non-ferrous material to form a mixture having a selected uniform density;
   (c) determining a selected weight of magnetic material for a particular installation of an NMR assembly;
   (d) heating the mixture;
   (e) extruding a selected volume of the heated mixture corresponding to the selected weight of magnetic material into a container; and
   (f) cooling the mixture to form a shimming body.

6. The method according to claim 5 wherein the container has an open "U" shape.

7. The method according to claim 5 wherein the container has a bottom, and sides connected to said bottom, said bottom and sides being formed from a thermosetting plastic, and wherein a top formed from a thermosetting plastic is placed on the sides after the heated mixture is extruded into the container.

8. The method according to claim 5 wherein the container is partially filled with the heated mixture.

9. The method according to claim 5 wherein the container is 25–50% filled with the heated mixture.

10. The method according to claim 5 wherein the container is completely filled with the heated mixture.

11. The method according to claim 5 wherein the non-ferrous material is a thermoplastic material.

12. A method of forming a shimming body for a NMR assembly comprising the steps of:
   (a) providing a ferrous powder of known magnetic properties;
   (b) uniformly dispersing said powder into a non-ferrous material to form a mixture having a selected uniform density;
   (c) determining a selected weight of magnetic material for a particular installation of an NMR assembly;
   (d) heating the mixture;
   (e) extruding a selected volume of the heated mixture corresponding to the selected weight of magnetic material into a container so that the container is at least 25% filled with the heated mixture; and
   (f) cooling the mixture to form a shimming body.

13. A method of forming a shimming body for a NMR assembly comprising the steps of:
   (a) providing a ferrous powder of known magnetic properties;
   (b) uniformly dispersing said powder into a non-ferrous material to form a mixture having a selected uniform density;

(c) determining a selected weight of magnetic material for a particular installation of an NMR assembly;

(d) heating the mixture;

(e) extruding a selected volume of the heated mixture corresponding to the selected weight of magnetic material into a container having a bottom and sides connected to said bottom formed from a thermosetting plastic;

(f) cooling the mixture; and (g) removing the mixture from the container to form a shimming body.

14. A method of forming a passive shimming disk for an open MRI assembly comprising the steps of:

(a) providing a neodymium-boron-iron alloy powder of known magnetic properties;

(b) uniformly dispersing said powder into a thermoplastic material to form a mixture having a selected uniform density;

(c) determining a selected weight of magnetic material in the mixture for a particular installation of an MRI assembly;

(d) heating the mixture;

(e) extruding a selected volume of the heated mixture corresponding to the selected weight of magnetic material into an open U-shaped container formed from a thermosetting plastic; and (f) cooling the mixture to form a shimming disk.

15. The method according to claim 14 wherein the container is partially filled with the heated mixture.

16. The method according to claim 14 wherein the container is completely filled with the heated mixture.

17. A method of forming a passive shimming disk for an open MRI assembly comprising the steps of:

(a) providing a neodymium-boron-iron alloy powder of known magnetic properties;

(b) uniformly dispersing said powder into a thermoplastic material to form a mixture having a selected uniform density;

(c) determining a selected weight of magnetic material for a particular installation of an MRI assembly;

(d) heating the mixture;

(e) extruding a selected volume of the heated mixture corresponding to the selected weight of magnetic material into an open U-shaped container formed from a thermosetting plastic so that the container is at least partially filled with the heated mixture; and (f) cooling the mixture to form a shimming disk.

18. A method of forming a passive shimming disk for an open MRI assembly comprising the steps of:

(a) providing a neodymium-boron-iron alloy powder of known magnetic properties;

(b) uniformly dispersing said powder into a thermoplastic material to form a mixture having a selected uniform density;

(c) determining a selected weight of magnetic material for a particular installation of an MRI assembly;

(d) heating the mixture;

(e) extruding a selected volume of the heated mixture corresponding to the selected weight of magnetic material into an open U-shaped container having a bottom and sides connected to said bottom formed from a thermosetting plastic so that the container is at least partially filled with the heated mixture;

(f) placing a top formed from a thermosetting plastic on the sides after the heated mixture is extruded into the container; and (g) cooling the mixture to form a shimming disk.

* * * * *